(12) United States Patent
Dsaak et al.

(10) Patent No.: US 11,887,867 B2
(45) Date of Patent: Jan. 30, 2024

(54) VACUUM ARRANGEMENT AND METHOD

(71) Applicant: VON ARDENNE Asset GmbH & Co. KG, Dresden (DE)

(72) Inventors: Torsten Dsaak, Dresden (DE); Thomas Meyer, Dresden (DE); Bernd Teichert, Dresden (DE); Ralf Biedermann, Dresden (DE)

(73) Assignee: VON ARDENNE ASSET GMBH & CO. KG, Dresden (DE)

( * ) Notice: Subject to any disclaimer, the term of this patent is extended or adjusted under 35 U.S.C. 154(b) by 966 days.

(21) Appl. No.: 16/452,560

(22) Filed: Jun. 26, 2019

(65) Prior Publication Data
US 2020/0006091 A1    Jan. 2, 2020

(30) Foreign Application Priority Data

Jun. 27, 2018  (DE) .................. 10 2018 115 410.0

(51) Int. Cl.
*H01L 21/67* (2006.01)
*C23C 14/56* (2006.01)
(Continued)

(52) U.S. Cl.
CPC ...... *H01L 21/67034* (2013.01); *C23C 14/566* (2013.01); *F26B 5/042* (2013.01); *F26B 5/06* (2013.01)

(58) Field of Classification Search
CPC ......... H01L 21/67034; H01L 21/67017; H01L 21/6776; H01L 21/67173; C23C 14/021;
(Continued)

(56) References Cited

U.S. PATENT DOCUMENTS 5,174,881 A * 12/1992 Iwasaki ............... C23C 16/0236
156/345.31
5,314,541 A * 5/1994 Saito ................. H01L 21/67201
118/724
(Continued)

FOREIGN PATENT DOCUMENTS

DE   10 2007 058 052 A1   6/2009
DE   11 2009 001 885 T5   5/2011
(Continued)

OTHER PUBLICATIONS

Office Action received for the corresponding DE Patent Application 10 2018 115 410.0 dated Feb. 26, 2019 (7 pages) (reference purpose only).

*Primary Examiner* — Edelmira Bosques
*Assistant Examiner* — Bao D Nguyen
(74) *Attorney, Agent, or Firm* — VIERING, JENTSCHURA & PARTNER mbB

(57) ABSTRACT

According to various embodiments, a vacuum arrangement may comprise the following: a first dehydration chamber and a second dehydration chamber, which are gas-separated from one another; a substrate transfer chamber for changing clocked substrate transport into continuous substrate transport towards the second dehydration chamber; a first high-vacuum pump of gas-transfer type for evacuating the first dehydration chamber; and a second high-vacuum pump of gas-binding type for evacuating the second dehydration chamber; wherein the first dehydration chamber is, with respect to the substrate transport, arranged between the second dehydration chamber and the substrate transfer chamber.

18 Claims, 6 Drawing Sheets

(51) Int. Cl.
*F26B 5/06* (2006.01)
*F26B 5/04* (2006.01)

(58) Field of Classification Search
CPC ... C23C 14/566; C23C 14/568; C23C 14/564; C23C 16/4412; C23C 14/56; F26B 5/042; F26B 5/06; B01J 3/02
See application file for complete search history.

(56) References Cited

U.S. PATENT DOCUMENTS

| | | | |
|---|---|---|---|
| 5,901,751 A | 5/1999 | Huo | |
| 5,968,328 A * | 10/1999 | Teschner | C23C 14/568 204/192.12 |
| 6,176,932 B1 * | 1/2001 | Watanabe | C23C 14/56 118/719 |
| 6,365,531 B1 * | 4/2002 | Hayashi | H01L 21/67028 257/E21.228 |
| 2009/0142165 A1 | 6/2009 | Krause et al. | |
| 2011/0142746 A1 * | 6/2011 | Reed | C23C 14/564 118/724 |
| 2011/0143033 A1 * | 6/2011 | Iijima | C23C 14/021 118/726 |

FOREIGN PATENT DOCUMENTS

| | | |
|---|---|---|
| DE | 10 2011 007 619 A1 | 10/2012 |
| DE | 10 2013 106 828 B3 | 11/2014 |

\* cited by examiner

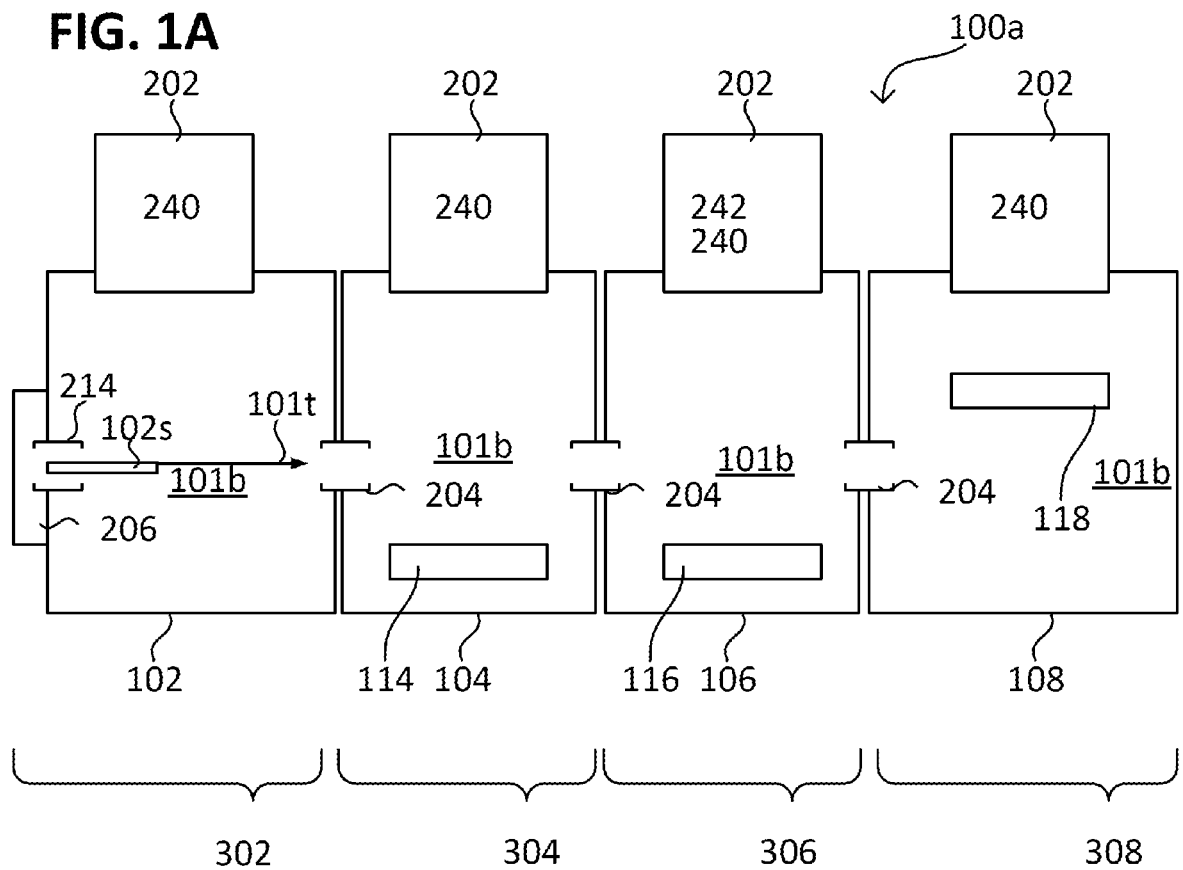
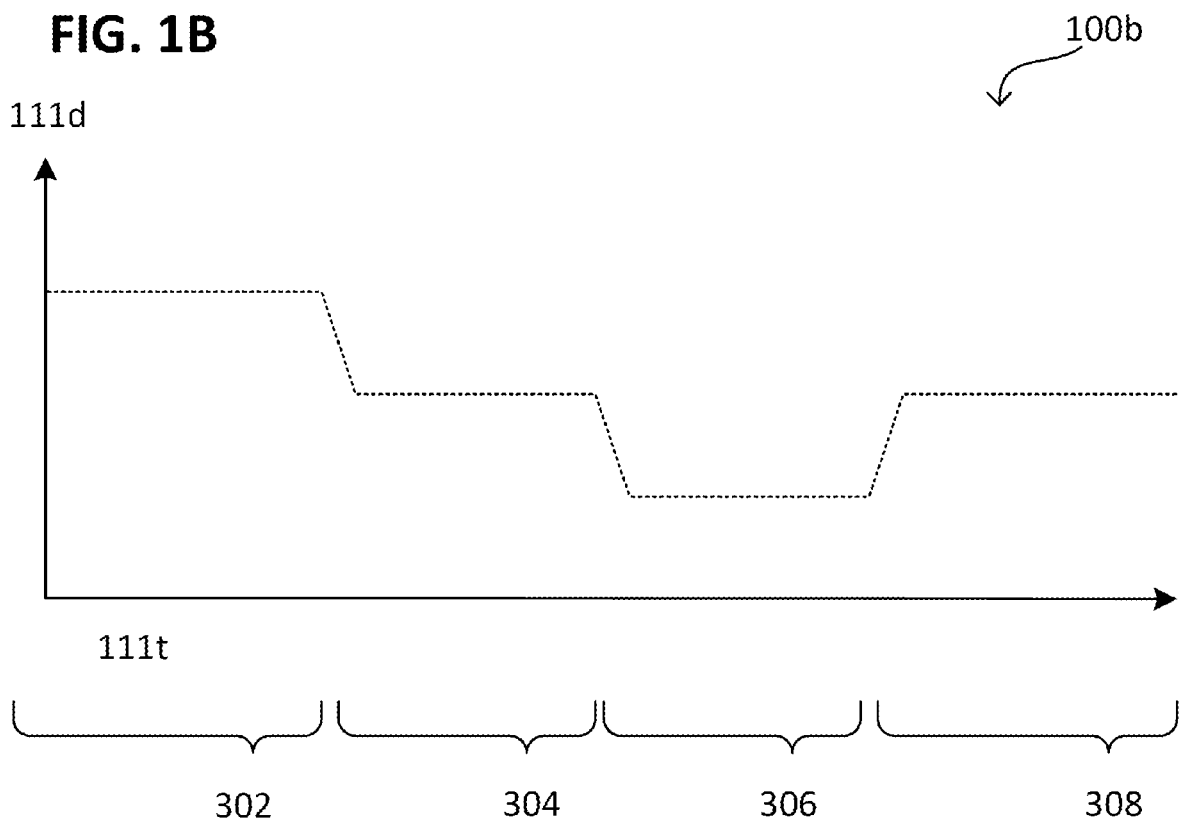

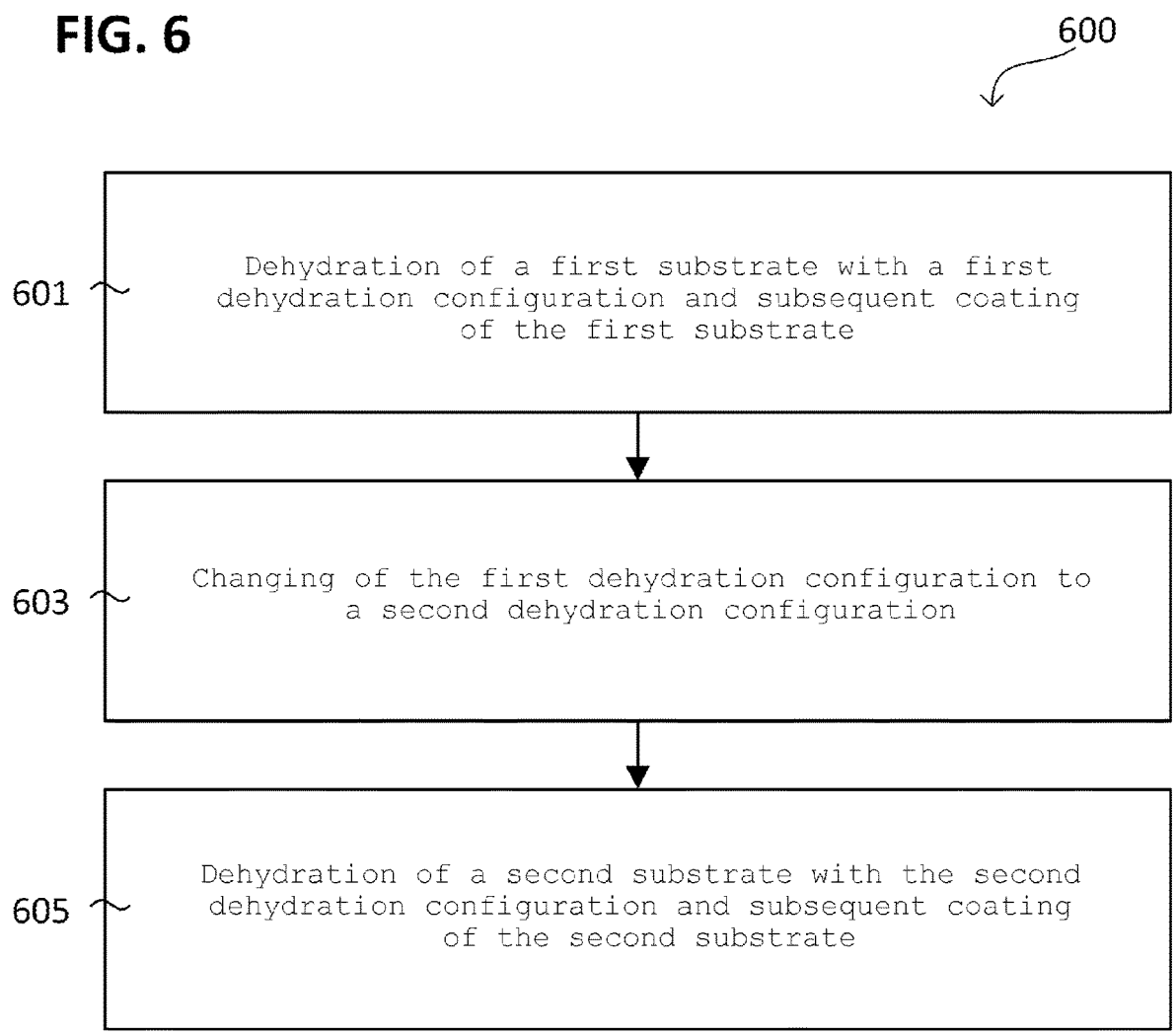

VACUUM ARRANGEMENT AND METHOD

CROSS-CITING TO RELATED APPLICATIONS

The present application claims priority to German Application 10 2018 115 410.0, which was filed on Jun. 27, 2018, which is fully incorporated herein by reference.

TECHNICAL FIELD

The disclosure relates to a vacuum arrangement and a method.

BACKGROUND

In general, a substrate may be treated (processed), for example coated, in a vacuum, such that the chemical and/or physical characteristics of the substrate can be varied. For the coating of a substrate in a vacuum, various coating methods may be implemented. For example, a vacuum coating installation may be utilized in order to deposit a layer or multiple layers on a substrate or on multiple substrates by means of a chemical and/or physical vapour deposition process.

In order to be able to realize a deposition over a large area on a correspondingly large-area, for example plate-like, substrate in an efficient manner, a so-called processing installation may be utilized in which the substrate is transported, for example by means of rollers, through the entire processing installation and the vacuum chambers thereof. Different vacuum chambers of a vacuum installation may be separated from one another by means of so-called chamber walls or bulkhead partitions, for example by means of vertical chamber walls or vertical bulkhead partitions in the case of horizontal continuous coating installations (in-line installations). Furthermore, the vacuum installation may, at an input side and/or output side, have in each case one lock chamber such that a substrate can be introduced into the vacuum installation and/or discharged out of the vacuum installation.

The coating of the substrate may make it necessary for the surface of the substrate (substrate surface) to be pretreated, for example for water deposits to be removed therefrom (also referred to as dehydration, desorption or drying). For example, water residues on the surface of the substrate can impair the quality of the applied coating. For this purpose, the substrate is normally warmed in a dehydration chamber, such that water evaporates from the surface thereof, that is to say the water is desorbed. The water vapour thus formed (that is to say the desorbed water) is then separated from the substrate.

Normally, in a dehydration chamber, use is made of a Meissner trap for binding the desorbed water which departs from the substrate surface during heated processes. A Meissner trap is based on the principle of accumulating the desorbed water on a cooling surface and changing it into a solid state there. Here, the cooled surface is gradually coated with water ice. Firstly, the water ice thermally insulates the cooled surface, such that the performance of the Meissner trap decreases during operation. Secondly, a solid casing of ice thus forms, which increasingly blocks, and can damage, the Meissner trap. Therefore, the service life of a Meissner trap is limited, because it is necessary for this to be serviced at regular intervals, which makes it necessary to open the vacuum chamber in order to remove the water ice. This however interrupts the operation of the processing installation and thus entails additional costs.

SUMMARY

According to various embodiments, a vacuum arrangement and a method are provided which reduce the water mass flow in the direction of the Meissner trap, lengthen the service life thereof, control the service life thereof, improve the resistance to thermal influences (for example heating processes in the immediate vicinity) and/or simplify the producibility thereof.

According to various embodiments, it has been identified that the Meissner trap is conventionally operated in combination with one or more than one turbomolecular pump, that is to say evacuates the volume for evacuation (also referred to as recipient) simultaneously together with said turbomolecular pump(s). In this combination, the turbomolecular pump is intended to provide the high vacuum to be achieved in order to introduce as little gas as possible into the downstream coating process. By contrast, the Meissner trap is intended to bind the water that remains in the high vacuum.

This combination reliably provides a low final pressure with a low water content. In this context, it has been identified that the turbomolecular pump, in the high vacuum, however pumps out little or no further water, such that the Meissner trap bears a major part of the load in the removal of the water. The water pumping capacity of the turbomolecular pump clearly decreases considerably with lower pressure.

By contrast, according to various embodiments, use is made of the fact that, for a turbomolecular pump, little or no demand for maintenance arises if it pumps out more water. In order that the turbomolecular pump may bear a greater load in the removal of the water, it is the intention in these various embodiments to operate in a higher pressure range, which is separated in terms of gas and pressure from the working point of the Meissner trap at relatively low pressure (also referred to as gas-separated).

According to various embodiments, the dehydration (also referred to as desorption) is provided in various pressure stages, of which a first pressure stage is provided for by a turbomolecular pump and a second pressure stage is provided for by a Meissner trap. The turbomolecular pump operates at elevated pressure, such that it pumps out more water, whereas the resulting gas composition is fed to the Meissner trap, which subsequently binds the water remaining therein. The dehydration load on the Meissner trap is thus reduced.

In this context, it has furthermore been identified that the Meissner trap is conventionally designed so as to bind as much desorbed water as possible. In this context, it has been identified, by way of illustration, that the actual requirements of the downstream coating process have not been taken into consideration in the design of the Meissner trap. For example, some coating processes tolerate more water residues on the substrate surface than others without the need to accept major losses in quality. This makes it possible for the Meissner trap to be set such that it binds just as much water as is required by the downstream coating process. The dehydration load on the Meissner trap is thus reduced.

According to various embodiments, a vacuum arrangement may have the following: a first dehydration chamber (also referred to as first desorption chamber) and a second dehydration chamber (also referred to as second desorption chamber), which are gas-separated from one another and of which optionally a heating device is arranged in each dehydration chamber; a substrate transfer chamber for changing clocked (e.g. cyclic, discrete, non-continuous) substrate transport into continuous substrate transport towards the first and/or second dehydration chamber; a first high-vacuum pump of gas-transfer type for evacuating the first dehydration chamber; and a second high-vacuum pump of gas-binding type for evacuating the second dehydration chamber; wherein the first dehydration chamber is, with respect to the substrate transport, arranged between the second dehydration chamber and the substrate transfer chamber.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiment. In the following description, various embodiments are described with reference to the following drawings, in which:

FIG. 1A shows a vacuum arrangement according to various embodiments in a schematic side view or cross-sectional view;

FIG. 1B shows a vacuum arrangement according to various embodiments in a schematic diagram.

FIGS. 5 and 6 each show a method according to various embodiments in a schematic flow diagram.

DETAILED DESCRIPTION

Figure 2A:
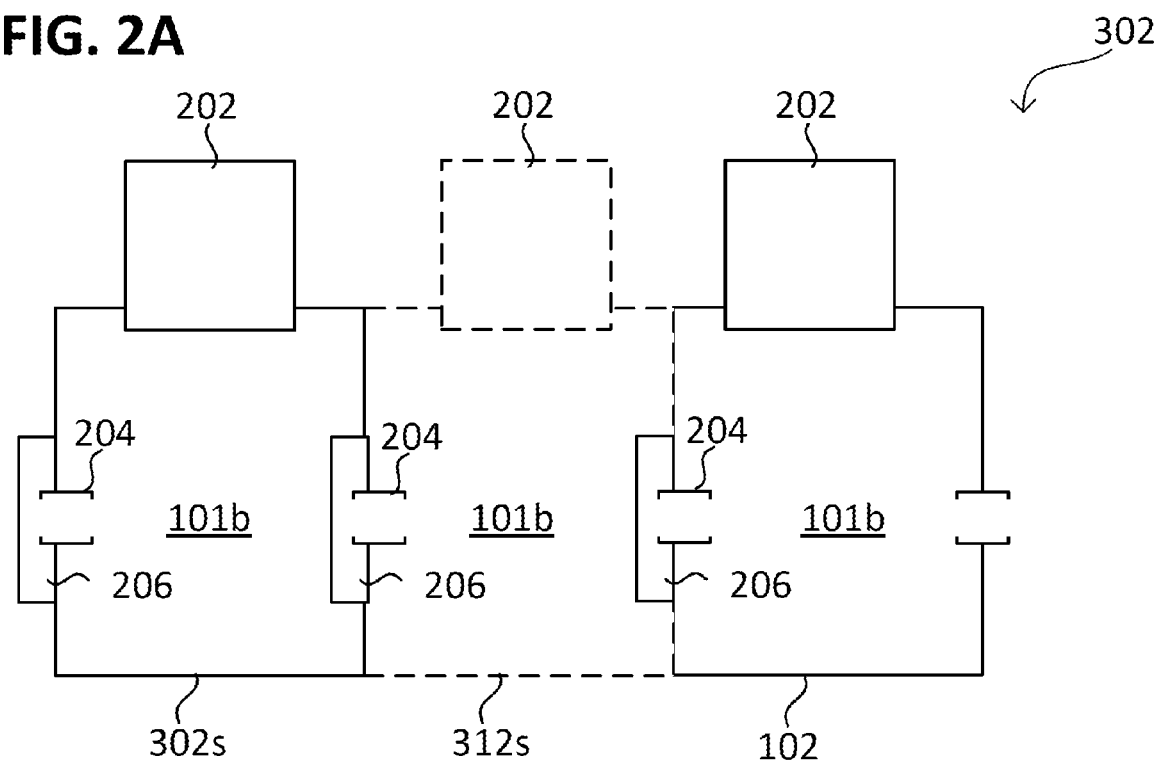
FIG. 2A shows a first pressure stage according to various embodiments in a schematic side view or cross-sectional view.

In the following detailed description, reference will be made to the appended drawings, which form part of this description and in which, for illustrative purposes, specific embodiments are shown in which the disclosure may be implemented. In this regard, directional terminology such as "upwards", "downwards", "forwards" "rearwards", "front", "rear" etc. is used in relation to the orientation of the described figure(s). Since components of embodiments may be positioned in a number of different orientations, the directional terminology serves for illustrative purposes and is in no way restrictive. It is self-evident that other embodiments may be utilized, and structural or logical modifications made, without departing from the scope of protection of the present disclosure. It is self-evident that the features of the various exemplary embodiments described herein may be combined with one another unless specifically stated otherwise. The following detailed description is therefore not to be considered in a restrictive sense, and the scope of protection of the present disclosure is defined by the appended claims.

In the context of this description, the expressions "connected", "attached" and "coupled" are used to describe both a direct and an indirect connection (for example ohmically and/or electrically conductive, for example an electrically conductive connection), a direct or indirect attachment and a direct or indirect coupling. In the figures, identical or similar elements have been denoted by identical reference designations where expedient.

According to various embodiments, the expression "coupled" or "coupling" may be understood in the sense of a for example mechanical, hydrostatic, fluid-conducting, thermal and/or electrical (for example direct or indirect) connection and/or interaction. Multiple elements may be coupled to one another, for example, along an interaction chain, along which the interaction (for example a signal) may be transmitted. For example, two coupled-together elements may exchange an interaction with one another, for example a mechanical, hydrostatic, fluid-conducting, thermal and/or electrical interaction. According to various embodiments, "engaged" may be understood in the sense of a mechanical (for example physical) coupling, for example by means of direct physical contact. An engagement may be configured to transmit a mechanical interaction (for example force, torque etc.).

In the context of vacuum components (for example a pump, a chamber, a line, a valve etc.), the expression "coupled" or "coupling" may be understood in the sense of a (for example fluid-conducting) connection to form a common vacuum system. The components of the vacuum system may be configured to exchange a gas with one another by means of the coupling (that is to say interact with one another in fluid-conducting fashion), wherein the coupling may be gas-separated (for example in vacuum-tight fashion) from surroundings of the vacuum system.

Multiple coupled-together vacuum chambers may be part of a common vacuum system, in which a vacuum may be generated by means of one or more vacuum pumps coupled to the vacuum chambers, wherein the gas flow between coupled-together vacuum chamber(s) and/or vacuum pump(s) may be realized by means of valves optionally connected in between.

Vacuum pumps are generally used for generating a vacuum. Here, vacuum pumps are distinguished from one another in terms of the vacuum they generate and in terms of their functional principle. Vacuum pumps are, depending on their physical operating principle, divided into gas-transferring vacuum pumps (that is to say vacuum pumps of gas-transfer type) and gas-binding vacuum pumps (that is to say vacuum pumps of gas-binding type).

A gas-transferring vacuum pump (also referred to as gas-transfer vacuum pump) transports gas particles either in a closed working space (also referred to as positive-displacement vacuum pump) or by momentum transfer to the gas particles (for example by means of shocks). Typical representatives of the gas-transfer type are for example diaphragm pumps, reciprocating-piston vacuum pumps, rotary slide pumps, shut-off slide vacuum pumps, rolling-piston pumps, screw-type vacuum pumps, molecular pumps, turbomolecular pumps or liquid jet pumps.

A gas-binding vacuum pump achieves its pump action by binding (for example sorbing, also referred to as sorption) the gas particles on a solid surface and thus reducing the pressure in the recipient. Gas-binding vacuum pumps (for example sorption pumps) include, inter alia, getter pumps, sublimation pumps, condensation pumps (for example a cryogenic pump) or adsorption pumps (a sorption pump in the case of which the gas is bound by physical adsorption to the inner surface of a highly porous material).

According to various embodiments, a vacuum pump may be configured to realize a low vacuum pressure (for example a pressure of less than $10^{-3}$ mbar). The or each vacuum pump may optionally be part of a multi-stage vacuum pump arrangement. A first pump stage (for example having a rotary slide pump) of the vacuum pump arrangement generates a pre-vacuum and is commonly referred to as pre-pump stage, wherein the downstream pump stage of the vacuum pump arrangement is connected to the recipient and provides, for example, a high vacuum. A multi-stage vacuum pump arrangement may for example have or be formed from one or more than one positive-displacement vacuum pump as pre-pump and one or more than one turbomolecular vacuum pump (also referred to as turbomolecular pump) as high-vacuum pump.

In general, (for example in the pre-vacuum or high vacuum), a vacuum pump of gas-transfer type (also referred to as gas-transfer vacuum pump) may provide a higher pumping rate for nitrogen (also referred to as nitrogen pumping rate) than a vacuum pump of gas-binding type (also referred to as gas-binding vacuum pump), for example more than ten times or one hundred times the nitrogen pumping rate. Alternatively or additionally (for example in the pre-vacuum or high vacuum), a gas-binding vacuum pump may provide a higher pumping rate for water (also referred to as water pumping rate) than a gas-transfer vacuum pump, for example more than ten times or one hundred times the water pumping rate.

According to various embodiments, a vacuum pump arrangement (having at least one high-vacuum pump) may be configured to provide, within a vacuum chamber, a vacuum (that is to say a pressure lower than 0.3 bar), for example a pressure in a range from approximately $10^{-2}$ mbar to approximately $10^{-3}$ mbar (in other words a pre-vacuum) or lower, for example a pressure in a range from approximately $10^{-3}$ mbar to approximately $10^{-7}$ mbar (in other words a high vacuum) or lower, for example a pressure of lower than high vacuum, for example lower than approximately $10^{-7}$ mbar (in other words an ultra-high vacuum). The pumping rate (that is to say standard volume evacuated per unit of time) may be related to a particular pressure, for example to a pre-vacuum, high vacuum and/or ultra-high vacuum.

A condensation pump is a pump type which makes use of the volume reduction of gases in the event of condensation. The simplest design is the so-called cold trap, in the case of which gases condense (freeze) as a result of cooling (with for example liquid nitrogen). However, the pump power of such a cold trap is dependent on the vapour pressure of the pumped gas and thus on the gas type. In the case of cooling with liquid helium, all constituents of the air, or in the case of cooling with hydrogen, almost all constituents of the air, are frozen (also referred to as cryogenic pump). The cooling may however also be provided in some other way, for example by means of a different refrigerant (for example in a compression refrigeration machine), such as for example ammonia, carbon dioxide or else some other hydrocarbon, or by means of a Peltier element.

Complex processes may require more effective gas separation than may be achieved by means of a chamber wall with a substrate transfer opening. For example, a coating of substrates with layers of different composition (for example different materials) may require different process conditions (for example reactive/oxidic in relation to metals, or different reactive gas compositions such as $Ar/N_2$ in relation to $Ar/O_2$) and, in association with this, effective separation of the process conditions from one another in terms of gas, which reduces mixing of the mutually different process conditions (gas separation).

The gas separation describes, by way of illustration, a difference in gas pressure and/or in gas composition between regions which are connected to one another in terms of a vacuum (for example gas-separated regions). The components (for example the parts of a gas separation structure) which contribute to the gas separation may be configured such that the difference in gas pressure or in gas composition between regions which are connected to one another in terms of a vacuum (for example gas-separated regions) may be maintained (for example in a stable manner). In other words, a gas exchange between regions which are connected to one another in terms of a vacuum and are gas-separated from one another may be reduced, for example the greater the gas separation between the regions is.

For example, the gas separation structure may have one or more than one aperture, which forms for example a gap and/or a tunnel (also referred to as gas separation gap or gas separation tunnel).

According to various embodiments, a gap may be configured for the gas separation (also referred to as gas separation gap). The gas separation gap may be understood as a gap which impedes a gas exchange through the gas separation gap. If the gap is configured to be able to also transport a substrate through it, the gas separation gap may also be referred to as transfer gap.

According to various embodiments, the gas separation gap (for example a transfer gap) may have a gap height (that is to say a spacing of the opposite bodies or surfaces between which the gas separation gap is formed) of less than 10 cm (for example a gap height of less than 9 cm, 8 cm, 7 cm, 6 cm, 5 cm, 4 cm, 3 cm, 2 cm or 1 cm), for example of less than 10 mm (millimetres). Alternatively or in addition, the gas separation gap may have a gap width (extent transversely with respect the gap height and/or transversely with respect to the transport direction) of more than 1 m (metre), for example more than 2 m. Alternatively or in addition, the gas separation gap may have a ratio (also referred to as extent ratio) of gap height to gap width of less than 0.1 (for example less than 0.05 or 0.02 or 0.01). A substrate transfer opening may, by contrast, have a ratio between height and width of greater than 0.1.

According to various embodiments, a chamber housing may be configured for providing a vacuum or at least a negative pressure within the chamber housing. By way of illustration, the chamber housing (for example the chamber walls thereof) may be designed to be stable enough that it may be evacuated (evacuated by pumping) such that a pressure (for example the prevailing air pressure or a pressure several times greater than the pressure in the interior of the chamber housing) may act on the chamber housing (or on the chamber walls thereof) from the outside when the latter has been evacuated without the chamber housing being irreversibly deformed and/or damaged. In other words, the chamber housing may be designed as a vacuum chamber.

The chamber housing may be a constituent part (a main body) of a vacuum arrangement and may have one or more than one vacuum chamber, for example one or more than one lock chamber, one or more than one buffer chamber, one or more than one transfer chamber, one or more than one process chamber (for example a coating chamber) and/or one or more than one gas separation chamber. Here, the respective functioning or the mode of operation of the vacuum chamber may be defined on the basis of the chamber cover used with the chamber housing, in conjunction with the fixtures arranged in the chamber housing (for example gas partitions, valves, filler bodies, transport system, etc.).

FIG. 1A illustrates a vacuum arrangement 100a according to various embodiments in a schematic side view or cross-sectional view. The vacuum arrangement 100a may have multiple vacuum chambers, of which a first vacuum chamber 102 is configured as substrate transfer chamber 102 (also referred to as transfer chamber), a second vacuum chamber 104 is configured as a first dehydration chamber 104, a third vacuum chamber 106 is configured as a second dehydration chamber 106, and at least one (that is to say one or more than one) fourth vacuum chamber 108 is configured as a coating chamber 108.

Of the multiple vacuum chambers 102, 104, 106, 108, each vacuum chamber may be part of a pressure stage 302, 304, 306, 308, as will be described in more detail further below.

Of the multiple vacuum chambers 102, 104, 106, 108, each vacuum chamber may be coupled, for example in fluid-conducting fashion, to a vacuum pump arrangement 202 and/or to the pump inlet thereof, of which each vacuum pump arrangement 202 may have one or more than one high-vacuum pump. Each vacuum pump arrangement 202 may for example have one or more than one high-vacuum pump 240 of gas-transfer type (also referred to as gas transfer pump arrangement 240), for example one or more than one turbomolecular pump.

At least the vacuum pump arrangement 202 (also referred to as third vacuum pump arrangement 202) coupled to the second dehydration chamber 106 may have one or more than one high-vacuum pump 242 of gas-binding type (also referred to as gas-binding pump arrangement 242), for example one or more than one cold trap (for example Meissner trap). Alternatively or in addition, the third vacuum pump arrangement 202 may have more high-vacuum pumps 242 of gas-binding type than the vacuum pump arrangement 202 coupled to the first dehydration chamber 104, to the first vacuum chamber 102 and/or to the at least one fourth vacuum chamber 108.

For example, at least the vacuum pump arrangement 202 coupled to the first dehydration chamber 104 may have no high-vacuum pump of gas-binding type. Alternatively or in addition, the vacuum pump arrangement 202 coupled to the first vacuum chamber 102 and/or to the at least one fourth vacuum chamber 108 may have no high-vacuum pump of gas-binding type.

The substrate transfer chamber 102 may be configured for changing clocked (e.g. cyclic, discrete, non-continuous) substrate transport into continuous substrate transport (also referred to as transport type change) towards the at least one coating chamber. This may for example be realized by virtue of two (for example mutually separately activated and/or driven) transport devices adjoining one another in the substrate transfer chamber 102, between which transport devices at least one substrate 102s is transferred. By way of illustration, the substrate transfer chamber 102 may output a continuously transported substrate band. In general, one or more than one substrate 102s may be transported in a transport direction 101t and/or through a transport region 101b along which the first dehydration chamber 104 is arranged downstream of the substrate transfer chamber 102, the second dehydration chamber 106 is arranged downstream of the first dehydration chamber 104 and the coating chamber 108 is arranged downstream of the second dehydration chamber 106.

The multiple vacuum chambers may be gas-separated from one another in pairwise fashion at least by means of a substrate transfer gap 204 (also referred to in simplified form as transfer gap). The transfer gap 204 may provide a gas-separating connection between two mutually adjacent vacuum chambers, through which connection multiple substrates 102s may be transported in continuous fashion. The transfer gap 204 may have a lower gas conductivity and/or cross-sectional area (transversely with respect to the transport direction 101t) than the chamber volume between two transfer gaps 204 (for example the transport region 101b). The provided gas separation may impede the gas exchange through the transfer gap 204. The gas conductivity may be understood as the reciprocal of the flow resistance.

The or each transfer gap 204 (for example between the multiple vacuum chambers 102, 104, 106, 108) may optionally be of always-open type, that is to say designed so as not to be closable, for example may have no substrate transfer flap and/or sealing surface. Alternatively or in addition, the transfer chamber 102 may have, at an input side, that is to say opposite the first dehydration chamber 104, a substrate transfer opening 214 and a substrate transfer flap 206. The substrate transfer flap 206 may, in an open state, provide (for example open up) a fluid-conducting connection through the substrate transfer opening 214 and, in a closed state, cover (for example in vacuum-tight fashion) the substrate transfer opening 214. The movement into the open state (opening) and into the closed state (closing) may be performed in the cycle of the clocked (e.g. cyclic, discrete, non-continuous) substrate transport.

For a substrate 102s, the clocked (e.g. cyclic, discrete, non-continuous) substrate transport may provide, over time, a greater fluctuation in its transport speed and/or spacing from the following substrate 102s than the continuous substrate transport. The clocked (e.g. cyclic, discrete, non-continuous) substrate transport may for example be understood as meaning that a substrate 102s is alternately (in a cycle and/or periodically) moved and stopped, that is to say its transport speed changes multiple times between zero and a finite value, and/or that multiple substrates 102s transported in succession differ in terms of their transport speeds. The continuous substrate transport may for example be understood as meaning that a substrate 102s has a transport speed which is substantially invariant over time, and/or that multiple (for example more than 5 or 10) successive substrates 102s have substantially identical transport speeds.

In the clocked (e.g. cyclic, discrete, non-continuous) substrate transport, the spacing of multiple substrates 102s transported in succession may fluctuate over time, for example by at least the extent of the multiple substrates 102s in a transport direction (for example by more than 1 m). Alternatively or in addition, in the continuous substrate transport, the spacing of multiple substrates 102s transported in succession may be invariant over time, and may be for example less than approximately 1 m, for example 10 cm.

A first heating device 114 may be arranged in the first dehydration chamber 104. A second heating device 116 may be arranged in the second dehydration chamber 106. The first heating device 114 and the second heating device 116 may be electrically coupled to one another, for example electrically selectively in series or parallel with respect to one another and/or such that they may be operated (for example activated) jointly.

One or more than one coating device 118 (also referred to as coating material source) may be arranged in the coating chamber 108.

According to various embodiments, the or each coating material source 118 may be configured for coating at least one substrate 102s (that is to say exactly one substrate 102s or multiple substrates 102s) which is transported for example through the transport region 101b in the coating chamber 108 (also referred to as coating region). For example, the or each coating material source may be configured for providing a gaseous coating material (material vapour) and/or liquid coating material, which may for example be deposited on the at least one substrate 102s so as to form a layer. A coating material source may have at least one of the following: a sputtering device, a thermal evaporation device (for example a laser beam evaporator, an arc evaporator, an electron beam evaporator and/or a thermal evaporator), a precursor gas source, a liquid phase atomizer. A sputtering device may be configured for atomizing the coating material by means of a plasma. A thermal evaporation device may be configured for evaporating the coating material by means of thermal energy. Depending on the nature of the coating material, alternatively or in addition to the thermal evaporation, that is to say a thermal change of a liquid state (liquid phase) into a gaseous state (gaseous phase), a sublimation, that is to say a thermal change of a solid state (solid phase) into a gaseous state, may also occur. In other words, the thermal evaporation device may also sublimate the coating material. A liquid phase atomizer may be configured for applying a coating material composed of the liquid phase, for example a dye.

For example, the coating material may have or be formed from at least one material of the following materials: a metal; a transition metal, an oxide (for example a metal oxide or a transition metal oxide); a dielectric; a polymer (for example a carbon-based polymer or a silicon-based polymer); an oxynitride; a nitride; a carbide; a ceramic; a metalloid (for example carbon); a perovskite; a glass or glass-like material (for example a sulphidic glass); a semiconductor; a semiconductor oxide; a semi-organic material, and/or an organic material.

The vacuum pump arrangement 202 coupled to the coating chamber 108 may be configured to extract gas from at least one coating chamber 108 such that a process atmosphere may be provided within the coating chamber 108. The process atmosphere may have a working gas and optionally a reactive gas or a gas mixture composed of multiple working gases and multiple optional reactive gases.

The vacuum arrangement 100a may optionally have a control device which may be coupled to one or more constituent parts of the vacuum arrangement 100a for the purposes of controlling, in open-loop and/or closed-loop fashion, the operating point in one or more than one vacuum chamber of the vacuum arrangement 100a, for example the temperature (also referred to as process temperature) therein, the pressure (also referred to as chamber internal pressure or total pressure) therein, one or more than one partial pressure therein and/or chemical composition of the atmosphere therein. In other words, the operating point may be set or controlled in closed-loop fashion, for example during the coating, the dehydration, the heating and/or the evacuation.

The vacuum arrangement 100a may optionally have, at an input side and/or output side, in each case one additional lock chamber (not illustrated), as will be described in more detail further below.

FIG. 1B illustrates a vacuum arrangement, for example the vacuum arrangement 100a, according to various embodiments in a schematic diagram 100b, in which the chamber internal pressure 111d is plotted over the transport path lilt in the transport direction 101t. The vacuum arrangement may generally have multiple pressure stages 302, 304, 306, 308 which are gas-separated from one another (for example of always-open type) and/or of which each pressure stage has: one or more than one vacuum chamber and a vacuum pump arrangement coupled thereto.

One or each pressure stage 302, 304, 306, 308 may for example have at least the components that contribute to the generation of pressure (for example the entirety thereof), for example vacuum chamber(s), vacuum pump(s), inlet-side gas separation, output-side gas separation, optional gas feed, etc.

The gas separation may provide that in each case two successive pressure stages differ from one another in pairwise fashion in terms of their atmosphere (for example in the interior of the vacuum chamber(s) thereof), for example in terms of the pressure (also referred to as chamber internal pressure or atmospheric pressure) and/or the chemical composition (also referred to as atmospheric composition) of the atmosphere. The vacuum pump arrangement may provide the chamber internal pressure, for example as described above.

Of the multiple pressure stages, a first pressure stage 302 or the transport device therein may be configured for the change of the transport type. Of the multiple pressure stages, a second pressure stage 304 may have the first dehydration chamber 104. Of the multiple pressure stages, a third pressure stage 306 may have the second dehydration chamber 106. Of the multiple pressure stages, a fourth pressure stage 308 (also referred to as coating stage) may be configured for the substrate coating, for example may have one or more than one coating chamber 108.

Along the transport direction 101t, the chamber internal pressure may differ between two successive pressure stages, for example by at least one order of magnitude (that is to say a factor of at least approximately 10, for example at least approximately 100). The pressure may fall along the transport direction 101t as far as the third pressure stage 306 and may then increase again towards the coating stage 308, for example to a value higher than a chamber internal pressure of the second dehydration chamber 106 and/or of the first dehydration chamber 104.

The second pressure stage 304 may optionally be free from a high-vacuum pump of gas-binding type or may have at least fewer high-vacuum pumps of gas-binding type than the third pressure stage 306.

The first pressure stage 302 and/or the second pressure stage 304 (for example the vacuum pump arrangement and/or heating device thereof) may be configured to provide a dehydration operating point. The dehydration operating point may be defined in terms of at least a dehydration temperature (that is to say the chamber internal pressure at which the dehydration is performed) and/or a dehydration pressure (that is to say the chamber internal pressure at which the dehydration is performed). The dehydration temperature may for example be in a range from approximately 130° C. to approximately 320° C., for example in a range from approximately 175° C. to approximately 250° C. The dehydration pressure may for example be in a range from approximately $10^{-2}$ mbar to approximately $10^{-3}$ mbar, for example in a range from approximately $10^{-2}$ mbar to approximately $10^{-3}$ mbar.

The multiple pressure stages may be provided by means of one or more than one chamber housing which has multiple vacuum chambers. Of the multiple vacuum chambers, at least one vacuum chamber may be part of in each case one pressure stage of the multiple pressure stages.

The multiple pressure stages 302, 304, 306, 308 (for example the vacuum chambers thereof) may be connected to one another by means of a substrate transfer opening 204, such that these form, for example, a common vacuum system. The vacuum system may be closed off in substantially air-tight fashion to the outside, for example by means of at least one valve, at least one chamber cover and/or at least one transfer opening flap.

FIG. 2A illustrates the first pressure stage 302 according to various embodiments in a schematic side view or cross-sectional view.

The first pressure stage 302 may have: a lock chamber 302s (provided for example by means of a first vacuum chamber) for the introduction, via a lock, of a substrate 102s into the vacuum arrangement and/or for the discharge, via a lock, of a substrate 102s out of the vacuum arrangement, an optional buffer chamber 312s (provided for example by means of a second vacuum chamber) for storing a substrate 102s, the transfer chamber 102 (provided for example by means of a third vacuum chamber) for forming a substrate band (of a continuously transported sequence of substrates 102s) of multiple substrates 102s.

Figure 2B:
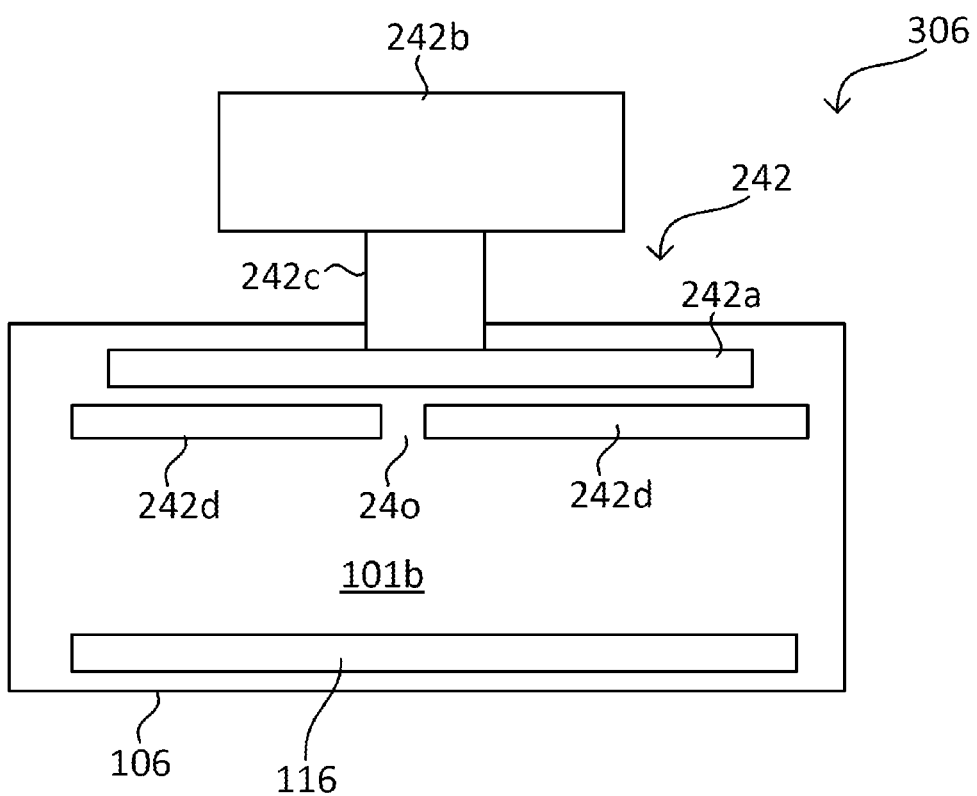
FIG. 2B shows a third pressure stage according to various embodiments in a schematic side view or cross-sectional view.

FIG. 2B illustrates the third pressure stage 306 according to various embodiments in a schematic side view or cross-sectional view.

The third pressure stage 306 may have one or more than one high-vacuum pump 242 of gas-binding type (also referred to more generally as gas-binding pump arrangement 242).

For example, the third pressure stage 306 may have more high-vacuum pumps 242 of gas-binding type and/or more gas-binding type suction capacity than the second pressure stage 304. Alternatively or in addition, the third pressure stage 306 may have a higher pumping rate, provided by means of the gas-binding pump arrangement 242, for water than the second pressure stage 304.

The or each high-vacuum pump 242 of gas-binding type may have: a gas-binding surface 242a, a cooling device 242b and a supply structure 242c, which couples (for example engages) the gas-binding surface 242a to the cooling device 242b (for example in fluid-conducting and/or electrical fashion), for example connects these to one another in fluid-conducting and/or electrical fashion.

In general, the cooling device 242b may be configured to extract thermal energy from the gas-binding surface 242a, for example by means of a fluid or by electrothermal means, and/or to bring said gas-binding surface to a temperature of lower than the solidification temperature (also referred to as freezing point) of water and/or of lower than approximately 0° C. (for example −10° C., −25° C. or −50° C.). The solidification temperature of water may decrease with falling pressure. For example, at the dehydration operating point of the third pressure stage 306, it may be lower than approximately 0° C., −10° C., −25° C. or −50° C.

The cooling device 242b may for example be configured to generate a temperature difference and/or a heat flow counter to a temperature gradient. Depending on the configuration of the high-vacuum pump(s) 242 of gas-binding type, the cooling device(s) thereof may be based on different cooling principles, for example electrothermal (then also referred to as electrothermal semiconductor converter), based on thermal radiation (then also referred to as radiator) and/or based on a thermodynamic cycle (then also referred to as heat pump, for example a compression heat pump).

The or each high-vacuum pump 242 of gas-binding type may for example have: a heat exchanger 242a, a cooling appliance 242b and a fluidic connection 242c, which connects the heat exchanger 242a to the cooling appliance 242b in fluid-conducting fashion. The heat exchanger 242a may for example have a fluid line (for example a pipeline), for example in the form of a cooling hose or of otherwise meandering form. For example, the cooling device 242b may be configured for feeding the heat exchanger 242a, for example with a temperature-controlled fluid (for example a cooling fluid). Alternatively or in addition, the cooling device 242b may be fed with electrical energy. For example, by means of the cooling device 242b, a cooling fluid may be fed to, and received again from, the heat exchanger 242a. Optionally, the cooling device 242b may be arranged outside the second dehydration chamber 106.

Optionally, the or each high-vacuum pump 242 of gas-binding type may have a shield 242d which is arranged in the second dehydration chamber 106. The shield 242d may shield at least a first part of the gas-binding surface 242a (also referred to as shielded area), for example with respect to the transport region 101b and/or the second heating device 116. Furthermore, the shield 242d may expose a second part (also referred to as exposed area) of the gas-binding surface 242a, for example with respect to the transport region 101b and/or the second heating device 116. The exposure may be provided for example by means of one or more than one opening 24o.

The transport region 101b may be arranged between the gas-binding pump arrangement 242 and the second heating device 116.

For example, the shield 242d may have or be formed from a plate (for example a metal sheet or some other flat main body) in which the one or more than one opening 24o is formed.

The ratio (also referred to as suction access area ratio) of the exposed area to the shielded area may for example be configured to be less than approximately 50% (for example 40%, 30%, 20%, 10%, 5%) and/or adjustable, for example by means of one or more than one regulator element 314 and/or a control device. The or each regulator element 314 may for example be of flat form and, depending on position and/or orientation, partially cover at least one opening 24o of the shield 242d. For example, the or each regulator element 314 may have a fin, a cover, a cap, a flap, a hood or the like.

The second heating device 116 and/or the first heating device 114 (cf. FIG. 1A) may be configured to provide the dehydration temperature, for example by radiating a corresponding amount of thermal radiation.

The second heating device 116 and/or the first heating device 114 may be a contactless heating device, for example using a thermal radiation source. The second heating device 116 and/or the first heating device 114 may have one or more than one resistive thermal radiation source.

Figure 3:
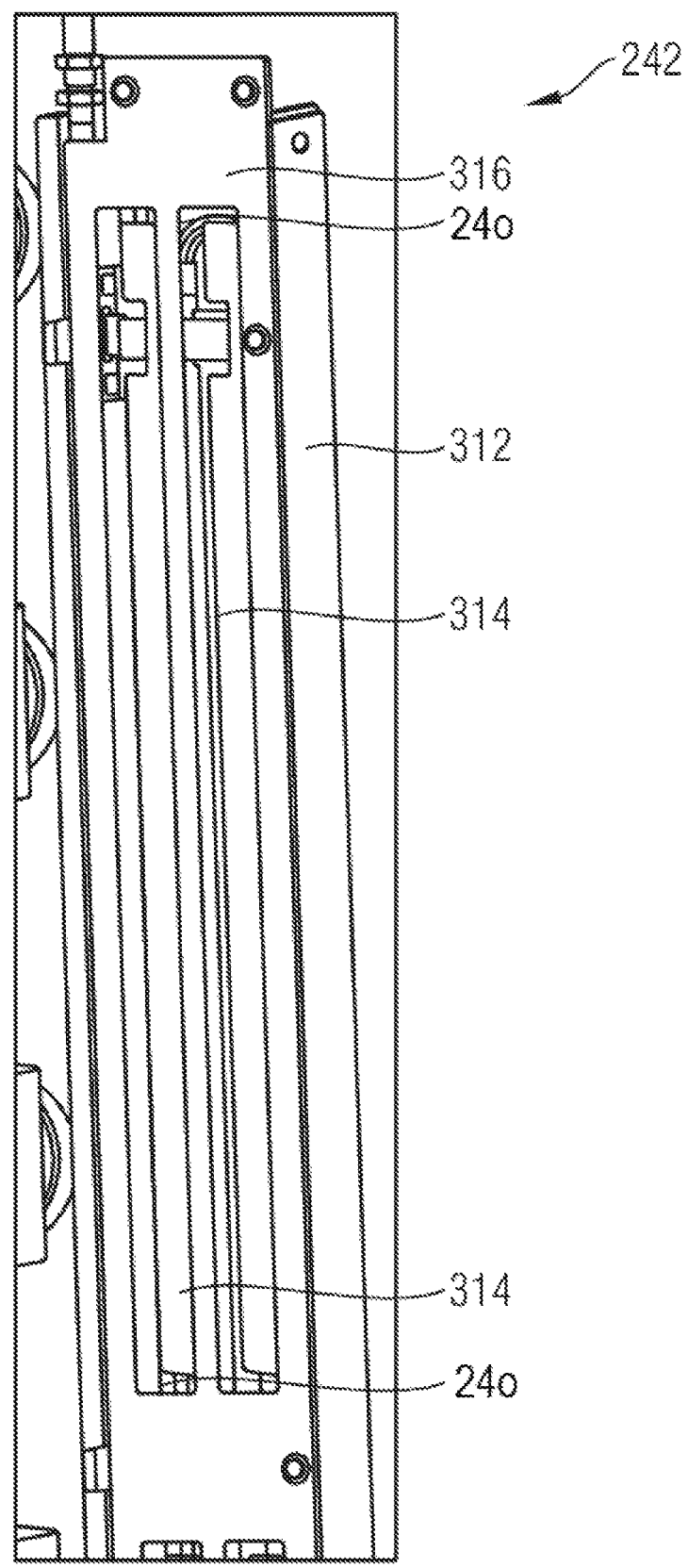
FIG. 3 shows a gas-binding pump arrangement according to various embodiments in a schematic perspective view.

FIG. 3 illustrates a gas-binding pump arrangement 242 according to various embodiments in a schematic perspective view.

The shield 242d may have a housing 312 or some other main body 312 which surrounds and/or laterally shields the shield and in which the one or more than one opening 24o (for example multiple openings) is formed. For example, multiple openings 24o may be formed in a (for example flat) cover 316 of the main body 312. The openings 24o may for example be elongate, for example parallel to one another.

Of the multiple openings 24o, at least a part, or each opening, may be partially covered and/or closed off by means of in each case one regulator element 314. The size of the exposed area may, for example, be adjusted by means of orientation (for example bending) of a respective regulator element 314. By way of illustration, an opening 24o may be opened or closed further by means of a regulator element 314. Optionally, the cover 316 of the housing 312 may be removed in order to increase the access.

The cover 316 may be of flat form. Alternatively or in addition, the regulator elements 314 may be arranged obliquely with respect to the flat cover and/or a cross section of the opening(s) 24o.

Figure 4:
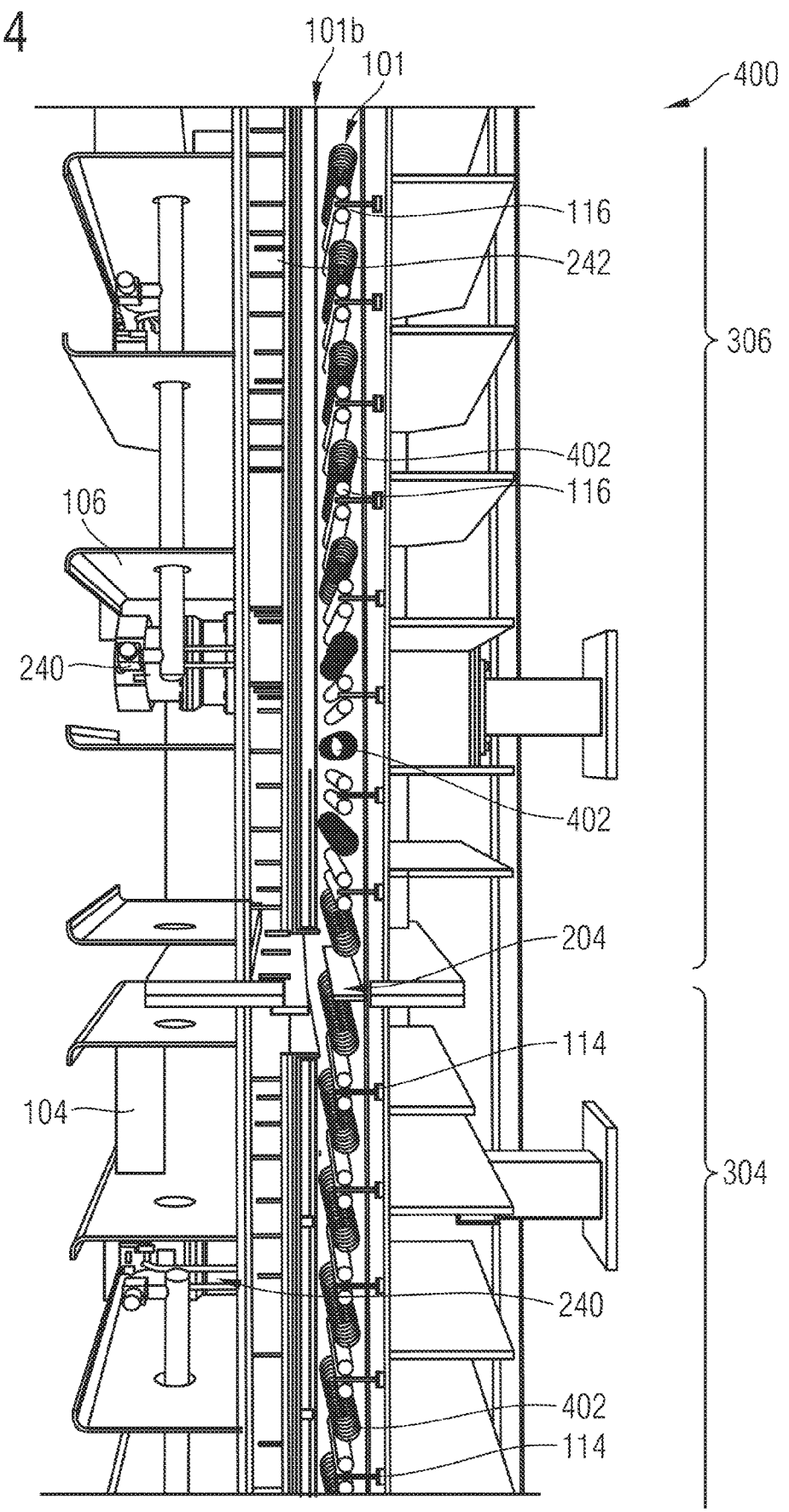
FIG. 4 shows a vacuum arrangement according to various embodiments in a schematic side view or cross-sectional view.

FIG. 4 illustrates a vacuum arrangement 400 according to various embodiments in a schematic side view or cross-sectional view, configured for example in the manner of the vacuum arrangement 100a.

The vacuum arrangement 400 may furthermore have a transport device 101 which has multiple transport rollers 402.

The vacuum pump arrangement 202 coupled to the first dehydration chamber 104 may have a gas-transfer pump arrangement 240 which has one or more than one gas-transfer vacuum pump.

The vacuum pump arrangement 202 coupled to the second dehydration chamber 106 may have a gas-binding pump arrangement 242 which has one or more than one gas-binding vacuum pump. Optionally, the vacuum pump arrangement 202 coupled to the second dehydration chamber 106 may have a gas-transfer pump arrangement 240 which has one or more than one gas-transfer vacuum pump.

The transfer gap 204 may for example be provided in or on a housing wall element, for example a bulkhead partition or a chamber wall, and/or by means of some other gas separation surface element (then also referred to as gas separation wall). For example, the housing wall element may have a substrate transfer opening which is covered and/or constricted by means of the gas separation surface element (for example a slotted metal sheet) in which the transfer gap is formed.

According to various embodiments, the variable and/or controllable shield 242d of one or more than one Meissner trap 242 is provided. The shield 242d permits a restriction/regulation of the suction access thereof and/or a lengthening of the service life thereof. The suction access may, by way of illustration, describe what fraction of the total area of the gas-binding surface is exposed, that is to say with what cross-sectional area the gas-binding vacuum pump effectively imparts an evacuation action.

According to various embodiments, an adjustable gas partition 204 is provided for the targeted differentiation and/or production of regions with relatively high and low water vapour partial pressure ($H_2O$ partial pressure).

By way of illustration, in regions with high $H_2O$ partial pressure, the use of TMP technology for pumping water may be provided (by way of illustration, providing a high suction power p*S for water), whereas the Meissner trap evacuates the region with low $H_2O$ partial pressure (considerable lengthening of the service life).

Instead of the Meissner trap, use may also be made of some other gas-binding vacuum pump.

Furthermore, the vacuum arrangement 400 may have a coating stage (not illustrated), for example in order to coat one or more than one substrate 102s therein by means of a coating process and/or a coating device. Furthermore, the vacuum arrangement 400 may have a transport device 101 for transporting at least one substrate 102s along a transport path in a transport direction 101t through the multiple pressure stages into the coating stage. Furthermore, the vacuum arrangement 400 may have one or more than one coating device 118, for example a coating material source. The coating device 118 may for example be configured for emitting at least one coating material in the direction of the transport path 111p and/or of the transport device 101.

Figure 5:
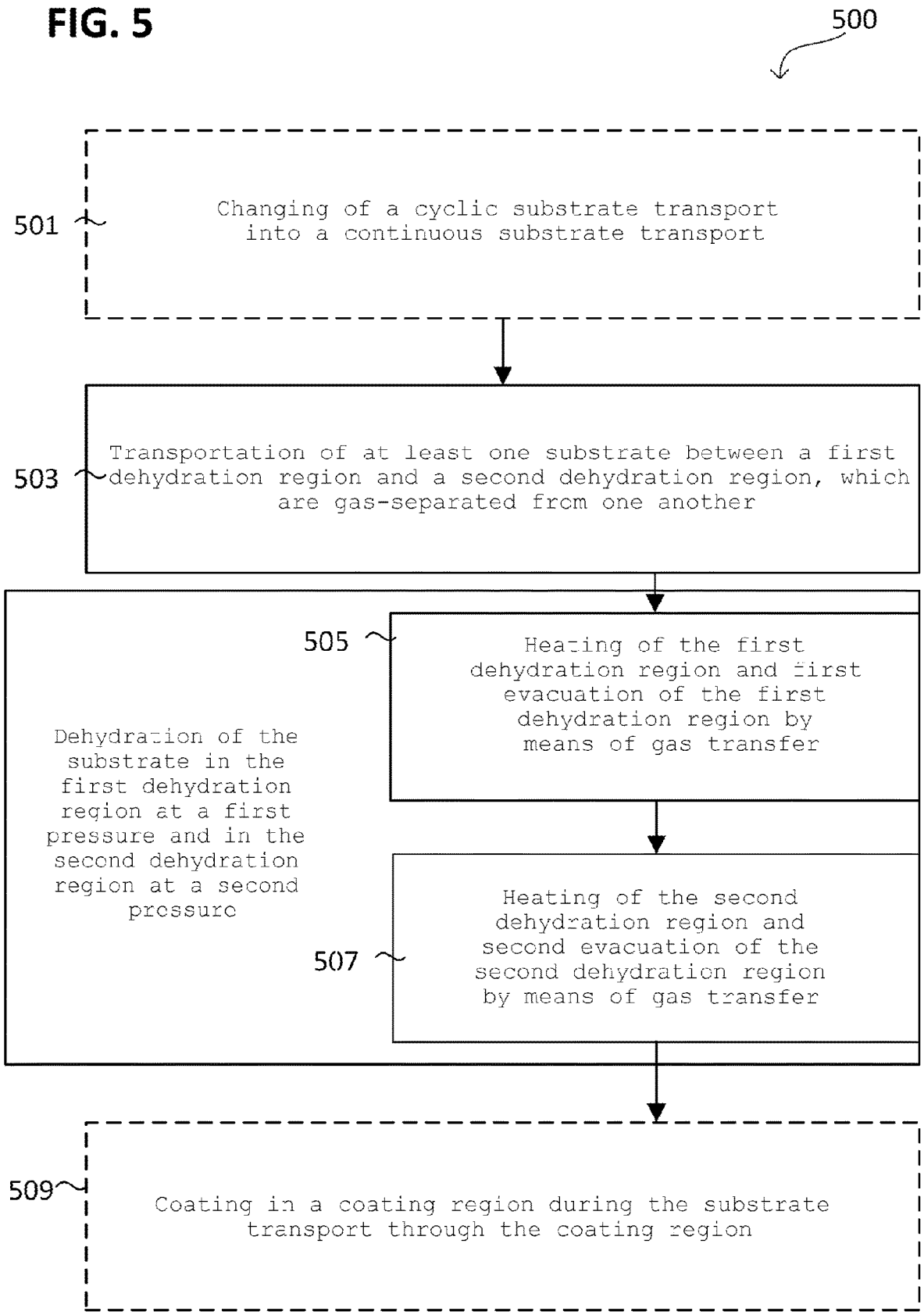

FIG. 5 illustrates a method 500 according to various embodiments in a schematic flow diagram, for example for operating the vacuum arrangement 100a or 400.

The method 500 may, in 501, optionally have: changing of clocked (e.g. cyclic, discrete, non-continuous) substrate transport into continuous substrate transport.

The method 500 may, in 503, have: transportation of at least one substrate 102s between a first dehydration region and a second dehydration region, which are gas-separated from one another.

The transportation 503 may have: feeding of the continuous substrate transport through the first dehydration region (for example the interior of the first dehydration chamber 104) into the second dehydration region (for example the interior of the second dehydration chamber 106).

The method 500 may, in 505, 507, have: dehydration (also referred to as desorption) of the substrate 102s in the first dehydration region at a first pressure and the second dehydration region at a second pressure. The dehydration may, in 505, have: heating of the first dehydration region and first evacuation of the first dehydration region by means of gas transfer (also referred to as first dehydration). The dehydration may, in 507, have: heating of the second dehydration region and second evacuation of the second dehydration region by means of gas binding (also referred to as second dehydration).

The method 500 may optionally, in 509, have: coating in a coating region (which is provided by means of the coating device 118) during the substrate transport through the coating region (also referred to as coating process).

The first dehydration may be performed at a higher total pressure (also referred to as chamber internal pressure) and/or hydrogen partial pressure than the second dehydration, for example at least a doubled total pressure. Alternatively or in addition, the first dehydration may take place at a lower temperature of the substrate 102s.

The substrate transport may have: one or more than one substrate 102s for transporting.

The first dehydration and the second dehydration may include extracting at least water (accumulated water) from the one or more than one substrate 102s, for example desorbing said water from the surface thereof. The first dehydration and the second dehydration may include pumping off the water desorbed from the substrate 102s.

FIG. 6 illustrates a method 600 according to various embodiments in a schematic flow diagram, for example for the adjustment of the vacuum arrangement 100a or 400.

The method 600 may, in 601, have: dehydration of a first substrate 102s with a first dehydration configuration and subsequent coating of the first substrate 102s. The method 600 may, in 603, have: changing of the first dehydration configuration to a second dehydration configuration. The method 600 may, in 605, have: dehydration of a second substrate 102s with the second dehydration configuration and subsequent coating of the second substrate 102s.

The dehydration configuration may be defined by the following parameters: by the dehydration operating point, by the gas separation of the two dehydration chambers (or of the dehydration regions provided therein) and/or the suction access of the gas-binding vacuum pump.

The changing of the dehydration configuration may include varying one or more than one parameter of the dehydration configuration.

The changing of the dehydration configuration may include varying a gas separation of two dehydration regions from one another and/or a suction access of a gas-binding vacuum pump by means of which the dehydration is performed.

The variation of the dehydration configuration (for example of the gas separation of the two dehydration regions) may include varying a transfer gap between the two dehydration regions, for example varying the expansion ratio of the transfer gap and/or the gap height of the transfer gap. Alternatively or in addition, the variation of the dehydration configuration (for example the variation of the suction access of the gas-binding vacuum pump) may include varying an area ratio (also referred to as suction access area ratio) between a covered area of the gas-binding vacuum pump and an exposed area of the gas-binding vacuum pump, for example covering or opening up an opening through which the gas-binding vacuum pump imparts a pumping action (for example by virtue of a regulator element 314 being varied in terms of its orientation and/or position).

The two pressure stages may have the second pressure stage 304 and the third pressure stage 306. The second pressure stage 304 may provide the first dehydration region (for example by means of the first dehydration chamber 104) and the third pressure stage 306 may provide the second dehydration region (for example by means of the second dehydration chamber 106).

The dehydration 601, 605 of the first and/or second substrate (or else multiple first and/or second substrates) may each include: first evacuation 505 of the first dehydration region and/or in the second pressure stage 304 (for example in the first dehydration chamber 104) by means of gas transfer and second evacuation 507 of the second dehydration region and/or in the third pressure stage 306 (for example in the second dehydration chamber 106) by means of gas binding and heating 505, 507 of the first dehydration region and of the second dehydration region.

Below, various examples will be described which relate to that which has been described above and that which is illustrated in the figures.

Example 1 is a vacuum arrangement, having: at least one coating chamber, in which a coating device is arranged, a substrate transfer chamber for changing clocked (e.g. cyclic, discrete, non-continuous) substrate transport into continuous substrate transport towards the at least one coating chamber; a first dehydration chamber and a second dehydration chamber, which are gas-separated from one another and which, with respect to the substrate transport, are arranged between the substrate transfer chamber and the at least one coating chamber, and of which, in each dehydration chamber, there is optionally arranged a heating device; a first high-vacuum pump of gas-transfer type for evacuating the first dehydration chamber; and a second high-vacuum pump of gas-binding type for evacuating the second dehydration chamber; wherein the second dehydration chamber is, with respect to the substrate transport, arranged between the first dehydration chamber and the coating chamber.

Example 2 is a vacuum arrangement, having: at least one optional coating chamber, in which a coating device is arranged, a first dehydration chamber and a second dehydration chamber, which are gas-separated from one another and of which, in each dehydration chamber, there is optionally arranged a heating device; a substrate transfer chamber for changing clocked (e.g. cyclic, discrete, non-continuous) substrate transport into continuous substrate transport towards the first dehydration chamber and/or second dehydration chamber; a first high-vacuum pump of gas-transfer type for evacuating the first dehydration chamber; and a second high-vacuum pump of gas-binding type for evacuating the second dehydration chamber; wherein the first dehydration chamber is, with respect to the substrate transport, arranged between the second dehydration chamber and the substrate transfer chamber.

Example 3 is the vacuum arrangement according to example 1 or 2, wherein the first dehydration chamber and the second dehydration chamber are gas-separated from one another by means of a substrate transfer gap (e.g. substrate transfer slit).

Example 4 is the vacuum arrangement according to example 3, wherein the substrate transfer gap has a smallest extent of less than 10 cm and/or provides a gas separation factor of less than 1/10.

Example 5 is the vacuum arrangement according to any of examples 1 to 4, wherein the first dehydration chamber and the first high-vacuum pump are part of a first pressure stage, and wherein the second dehydration chamber and the second high-vacuum pump are part of a second pressure stage; wherein the first pressure stage and the second pressure stage are configured such that, during operation, a chamber internal pressure (also referred to as operating pressure) in the first dehydration chamber is higher than in the second dehydration chamber; and/or wherein the first pressure stage has fewer high-vacuum pumps and/or lower suction capacity of gas-binding type than the first pressure stage (for example no high-vacuum pump or no suction capacity of gas-binding type).

Example 6 is the vacuum arrangement according to any of examples 1 to 5, wherein the first high-vacuum pump has a lower pumping rate for water gas than the second high-vacuum pump; and/or wherein the first high-vacuum pump has a higher pumping rate for nitrogen than the second high-vacuum pump.

Example 7 is the vacuum arrangement according to any of examples 1 to 6, wherein, during operation, a temperature of the first high-vacuum pump is higher than a temperature of the second high-vacuum pump.

Example 8 is the vacuum arrangement according to any of examples 1 to 7, wherein the first high-vacuum pump has a turbomolecular pump; and/or wherein the second high-vacuum pump has a cold trap (also referred as to condensation trap).

Example 9 is the vacuum arrangement according to any of examples 1 to 8, wherein the second high-vacuum pump has a heat exchanger (for example a cooling hose) and/or a heat sink (that is to say an absorber for thermal radiation).

Example 10 is the vacuum arrangement according to any of examples 1 to 9, wherein the heating device in the first dehydration chamber and/or in the second dehydration chamber is configured to provide a dehydration operating point.

Example 11 is the vacuum arrangement according to any of examples 1 to 10, wherein the heating device in the first dehydration chamber and the heating device in the second dehydration chamber provide a substantially identical heating power density and/or are coupled electrically in parallel with respect to one another and/or in series with respect to one another.

Example 12 is the vacuum arrangement according to any of examples 1 to 11, the vacuum arrangement furthermore having: a shield which is arranged in the second dehydration chamber between the second high-vacuum pump and a substrate transport region of the second dehydration chamber, wherein, for example, the substrate transport region is arranged between the second heating device 116 and the second high-vacuum pump; and/or the vacuum arrangement furthermore having: a first heating device which is arranged in the first dehydration chamber; and/or a second heating device, which is arranged in the second dehydration chamber.

Example 13 is the vacuum arrangement according to example 12, wherein the shield has at least one opening which exposes the second high-vacuum pump with respect to substrate transport region and/or connects the second high-vacuum pump in fluid-conducting fashion to the substrate transport region.

Example 14 is the vacuum arrangement according to example 13, wherein the shield has a flat (e.g. laminar) main body which is extended through by the at least one opening.

Example 15 is the vacuum arrangement according to example 13 or 14, wherein an area ratio of the area of the second high-vacuum pump exposed by means of the at least one opening to a shielded area of the second high-vacuum pump is less than 50%; and/or wherein the shield has at least one regulator element which at least partially covers the at least one opening.

Example 16 is the vacuum arrangement according to example 14 or 15, wherein the regulator element has a surface element which is for example arranged obliquely with respect to the flat main body.

Example 17 is the vacuum arrangement according to any of examples 1 to 16, wherein the at least one coating chamber is gas-separated from the second dehydration chamber, for example by means of a substrate transfer gap (e.g. substrate transfer slit).

Example 18 is the vacuum arrangement according to any of examples 1 to 17, wherein the substrate transfer chamber has (at an inlet side) a pivotably mounted valve flap.

Example 19 is the vacuum arrangement according to any of examples 1 to 18, furthermore having: a transport arrangement (having one or more than one transport device, of which each transport device has for example multiple transport rollers, and/or defining a transport region) which, in the substrate transfer chamber, is configured to provide the change of clocked (e.g. cyclic, discrete, non-continuous) substrate transport to continuous substrate transport, wherein the vacuum arrangement optionally furthermore has the coating chamber (in which for example a coating device is arranged), wherein, for example, the coating chamber is, in the direction of the substrate transport (also referred to as transport direction), the coating chamber which directly follows the substrate transfer chamber (for example the very first coating chamber), wherein, for example, the first dehydration chamber and the second dehydration chamber are arranged between the substrate transfer chamber and the coating chamber.

Example 20 is the vacuum arrangement according to example 19, wherein the transport arrangement is furthermore configured for the substrate transport in a transport direction from the substrate transfer chamber through the first dehydration chamber and the second dehydration chamber to or into the coating chamber.

Example 21 is a vacuum arrangement, having: a vacuum chamber, which has a transport region; a high-vacuum pump of gas-binding type for evacuating the vacuum chamber; a transport device (for example having multiple transport rollers and/or defining a transport region) for the substrate transport through the transport region; a shield which is arranged between the high-vacuum pump and the transport region in order to shield the high-vacuum pump.

Example 22 is the vacuum arrangement according to example 21, wherein the shield has at least one opening which exposes the high-vacuum pump with respect to the transport region and/or which connects the high-vacuum pump to the transport region in fluid-conducting fashion.

Example 23 is the vacuum arrangement according to example 22, wherein the shield has a flat (e.g. laminar) main body which is extended through by the at least one opening.

Example 24 is the vacuum arrangement according to example 22 or 23, wherein an area ratio of the area of the high-vacuum pump exposed by means of the at least one opening to the shielded area of the high-vacuum pump is less than 50%; and/or wherein the shield has at least one regulator element which at least partially covers the at least one opening.

Example 25 is the vacuum arrangement according to example 23 or 24, wherein the regulator element has a surface element which is for example oblique with respect to the flat main body.

Example 26 is a method, having: changing of clocked (e.g. cyclic, discrete, non-continuous) substrate transport into continuous substrate transport; feeding of the continuous substrate transport through a first dehydration region and a second dehydration region, which are gas-separated from one another, to a coating process; heating of the first dehydration region and of the second dehydration region (for example by means of emission of thermal radiation into these and/or by means of a thermal radiation source); first evacuation of the first dehydration region by means of gas transfer; and second evacuation of the second dehydration region by means of gas binding.

Example 27 is a method, having: changing clocked (e.g. cyclic, discrete, non-continuous) substrate transport into continuous substrate transport; feeding of the continuous substrate transport through a first dehydration region into a second dehydration region, which are gas-separated from one another, and optionally through the second dehydration region to a coating process; heating of the first dehydration region and of the second dehydration region; first evacuation of the first dehydration region by means of gas transfer; and second evacuation 507 of the second dehydration region by means of gas binding.

Example 28 is the vacuum arrangement according to example 26 or 27, wherein a higher pressure is provided in the first dehydration region than in the second dehydration region.

Example 29 is the vacuum arrangement according to any of examples 26 to 28, wherein the second evacuation is performed through at least one opening in a shield.

Example 30 is the vacuum arrangement according to any of examples 26 to 29, wherein the heating of the first dehydration region and the heating of the second dehydration region are performed such that dehydration of a substrate transported by means of the substrate transport is performed.

Example 31 is a method, having: transportation of at least one substrate from a first dehydration region into a second dehydration region, which are gas-separated from one another; dehydration of the substrate in the first dehydration region at a first pressure and in the second dehydration region at a second pressure; wherein the first pressure is higher than the second pressure and is provided by means of gas transfer vacuum pumping; and wherein the second pressure is provided by means of gas binding vacuum pumping (for example by means of one or more than one Meissner trap and one or more than one turbomolecular pump).

Example 32 is the vacuum arrangement, having: multiple pressure stages which are gas-separated from one another and of which each pressure stage has a vacuum chamber and a vacuum pump for evacuating the vacuum chamber, at least one coating stage which has a coating chamber and a coating device therein, a transport device for transporting a substrate through the multiple pressure stages in a transport direction towards the coating chamber, wherein the transport device in a first pressure stage of the multiple pressure stages is configured for changing clocked (e.g. cyclic, discrete, non-continuous) substrate transport into continuous substrate transport; wherein, of the multiple pressure stages, a second pressure stage and a third pressure stage optionally each have a heating device, and the second pressure stage is, with respect to the transport direction, arranged between the first pressure stage and the third pressure stage; wherein the vacuum pump of the second pressure stage is of the high-vacuum gas transfer type, and the vacuum pump of the third pressure stage is of the high-vacuum gas-binding type; wherein, for example, of the multiple pressure stages, an additional first pressure stage is configured for lock operation.

Example 33 is a method having: dehydration of a first substrate with a first dehydration configuration and subsequent coating of the first substrate; changing of the first dehydration configuration to a second dehydration configuration; dehydration of a second substrate with the second dehydration configuration and subsequent coating of the second substrate; wherein the changing includes varying a gas separation between two pressure stages (or dehydration regions provided therein) and/or a suction access of a gas-binding vacuum pump by means of which the dehydration is performed.

The invention claimed is:

1. Vacuum arrangement, comprising:
a first dehydration chamber and a second dehydration chamber, which are gas-separated from one another;
a substrate transfer chamber configured to change clocked substrate transport into continuous substrate transport towards the second dehydration chamber, wherein the substrate transfer chamber configured to change clocked substrate transport into continuous substrate transport comprises the substrate transfer chamber configured to change a noncontinuous movement speed of substrates transported within the chamber into a continuous movement speed;
a first high-vacuum pump of gas-transfer type for evacuating the first dehydration chamber;
a second high-vacuum pump of gas-binding type for evacuating the second dehydration chamber, wherein the second high-vacuum pump comprises a gas-binding surface that is located within the second dehydration chamber,
wherein the first dehydration chamber is, with respect to the substrate transport, arranged between the second dehydration chamber and the substrate transfer chamber; and
a shield arranged within in the second dehydration chamber between the gas-binding surface and a substrate transport region of the second dehydration chamber.

2. Vacuum arrangement according to claim 1,
wherein the first dehydration chamber and the second dehydration chamber are gas-separated from one another by means of a substrate transfer gap.

3. Vacuum arrangement according to claim 2,
wherein the substrate transfer gap has a smallest extent of less than 10 cm.

4. Vacuum arrangement according to claim 2, wherein the substrate transfer gap comprises an always-open transfer gap.

5. Vacuum arrangement according to claim 1,
wherein the first high-vacuum pump has a turbomolecular pump; and/or
wherein the second high-vacuum pump has a cold trap.

6. Vacuum arrangement according to claim 1,
wherein the shield has at least one opening through which gas may flow between the gas-binding surface and the substrate transport region.

7. Vacuum arrangement according to claim 6,
wherein the shield has a flat main body through which the at least one opening extends.

8. Vacuum arrangement according to claim 7,
wherein the shield has at least one regulator element which at least partially covers the at least one opening.

9. Vacuum arrangement according to claim 8, wherein the regulator element comprises a fin or an adjustable flap.

10. Vacuum arrangement according to claim 8, wherein the regulator element extends obliquely away from the flat main body.

11. Vacuum arrangement according to claim 1, further comprising:
a first heating device which is arranged in the first dehydration chamber; and/or
a second heating device, which is arranged in the second dehydration chamber.

12. Vacuum arrangement according to claim 1, wherein the shield comprises a flat main body with multiple openings through which gas may flow between the gas-binding surface and the substrate transport region.

13. Vacuum arrangement according to claim 12, wherein the multiple openings comprise elongated openings, each arranged in parallel to one another along the flat main body.

14. Vacuum arrangement according to claim 1, wherein the noncontinuous movement speed comprises a variable speed that varies over time, wherein the continuous movement speed comprises an invariable speed that is invariant over time.

15. A method, comprising:
transportation of at least one substrate from a first dehydration region into a second dehydration region, which are gas-separated from one another, wherein the transportation comprises changing from a clocked substrate transport to a continuous substrate transport towards the second dehydration chamber, wherein changing from the clocked substrate transport to the continuous substrate transport comprises changing a noncontinuous movement speed of the transportation of the at least one substrate into a continuous movement speed;
dehydration of the substrate in the first dehydration region at a first pressure and in the second dehydration region at a second pressure;
wherein the first pressure is higher than the second pressure and is provided by means of gas-transfer vacuum pumping,
wherein the second pressure is provided by means of gas-binding vacuum pumping; and
shielding at least a portion of the substrate by means of a shield that is arranged within in the second dehydration region between a gas-binding surface of the gas-binding vacuum pumping and a substrate transport region of the second dehydration region.

16. A vacuum arrangement comprising:
a first dehydration chamber;
a substrate transfer chamber for receiving substrates in succession at a discontinuous movement speed and for providing the substrates in succession at an invariant movement speed to the first dehydration chamber, wherein the substrate transfer chamber is configured to convert the discontinuous movement speed to the invariant movement speed;

a second dehydration chamber connected to the first dehydration chamber via an always-open substrate transfer gap, wherein the always-open substrate transfer gap is dimensioned to permit transfer of the substrates through the always-open substrate transfer gap at the invariant movement speed from the first dehydration chamber to the second dehydration chamber, wherein the always-open substrate transfer gap is configured to form, in combination with the transport of substrates within the always-open substrate transfer gap, a gas separation between the first dehydration chamber and the second dehydration chamber;

a gas-transfer vacuum pump fluidly connected to the first dehydration chamber for evacuating the first dehydration chamber; and a gas-binding vacuum pump fluidly connected to the second dehydration chamber for evacuating the second dehydration chamber.

17. The vacuum arrangement according to claim 16, wherein the substrate transfer gap comprises a gas separation gap having a cross section defined by a gap height and a gap width, wherein a ratio between the gap height and the gap width is less than 0.1.

18. The vacuum arrangement according to claim 16, wherein the gas separation gap is configured to, in combination with the transport of substrates within the always-open substrate transfer gap, impede air exchange through the substrate transfer gap.

* * * * *